March 17, 1970 HEINZ MARTIN ET AL 3,501,680

STRUCTURAL COMPONENT FOR HOUSING FOR SEMICONDUCTOR DEVICE

Original Filed May 27, 1966

United States Patent Office 3,501,680

Patented Mar. 17, 1970

3,501,680

STRUCTURAL COMPONENT FOR HOUSING FOR SEMICONDUCTOR DEVICE

Heinz Martin and Herbert Vogt, Munich, Germany, assignors to Siemens Aktiengesellschaft, Erlangen, Germany

Continuation of application Ser. No. 553,407, May 27, 1966. This application Aug. 15, 1968, Ser. No. 755,020
Claims priority, application Germany, June 5, 1965, S 97,501
Int. Cl. H01l *3/00, 5/00, 9/00*
U.S. Cl. 317—234 18 Claims

ABSTRACT OF THE DISCLOSURE

A structural member of electrically insulating material of a housing for a semiconductor device is positioned in an annular channel formed in a base member. A rod-like contact member passes into the housing. An electrical conductor has an end in proximity with the upper end of the contact member. The lower end of the contact member is positioned on the semiconductor device in the housing. A sleeve covers the proximate ends of the electrical conductor and the contact member and joins the conductor and member at their ends. The sleeve is notched or compressed with the electrical conductor at one base area and is notched or compressed with the contact member at the other base area.

DESCRIPTION OF THE INVENTION

Figures 1, 2:
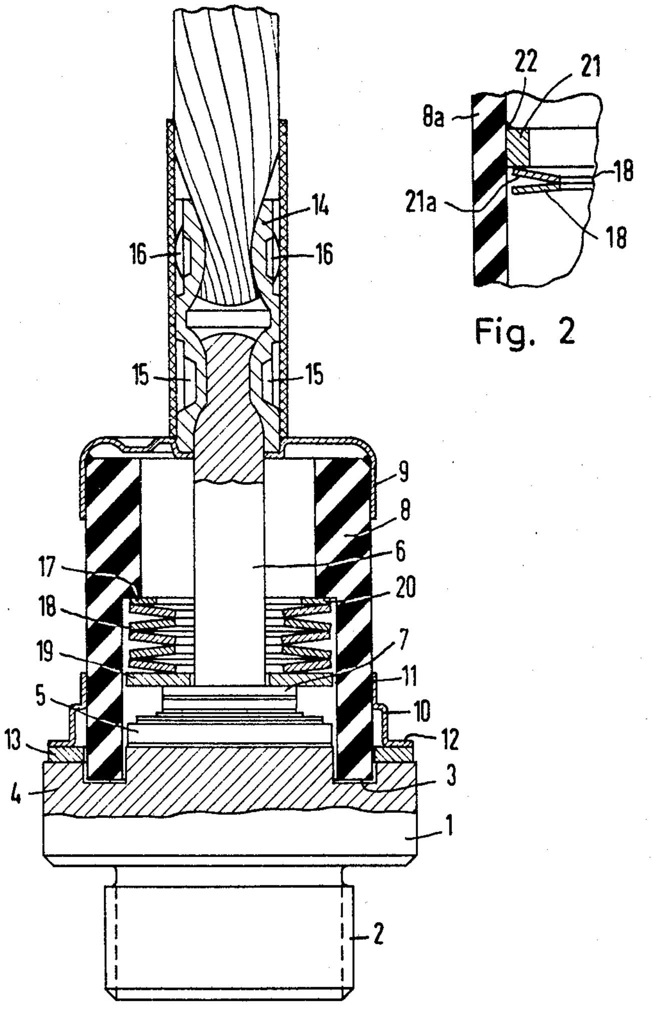

This application is a continuation of application Ser. No. 553,407, now abandoned.

The present invention relates to a structural component. More particularly, the invention relates to a structural component of a housing for a semiconductor device.

Semiconductor components, especially those cooperating with a semiconductor element or body of germanium or silicon, may be encased gastight in a capsule housing. The housing may comprise, for example, a base plate portion and a cup- or bell-shaped housing portion connected via a rim or flange with the base plate portion by soldering, welding or even resistance welding. The cup- or bell-shaped housing portion may be provided with one or more electrically insulating ducts in order to permit electrical conductors connected to the encapsuled semiconductor component to pass through the housing portion in a gastight manner. The base plate portion itself may be utilized as an electrical conductor.

It is expedient, during the manufacture of the device including such semiconductor components not to produce a rigid connection between the semiconductor component and the electrical conductors or leads and particularly not to the base plate portion. Such a connection is the result of the connection of the semiconductor element via its carrier plate to the base plate portion by soldering with soft or hard solder or even by welding. The base portion is usually produced from a material which is suitable for good conduction of the heat from the semiconductor element, but which has a thermal coefficient of expansion which is considerably different from that of the semiconductor element. Hence, various large mechanical expansions of adjacent parts would occur due to the different temperatures at the semiconductor element. This would result in an adverse mechanical stress upon the semiconductor components, as well as on the semiconductor element.

Such detrimental stresses may be avoided by the utilization of a common pressure contact at the junction points between the semiconductor element and the adjacent abutting parts of the semiconductor component or its housing, instead of a rigid mutual mechanical connection between the semiconductor component and the power supply conductor or lead, and particularly the ground plate. The pressure contact at the adjacent abutting areas is provided in such a manner that during operation the adjacent abutting surfaces are glidable or slidable relative to each other and such relative glidability or slidability is maintained at the pressure contact points. This type of pressure contact requires a suitable spring device in order to maintain an adequate pressure contact at the mutual bearing surfaces even during various heating conditions and various expansions of the components which occur during the manufacture of the device. The abutting components transfer heat and electrical current to each other at their bearing surfaces.

Semiconductor devices of the type discussed utilize a spring device which may comprise a single spring or a plurality or array of springs. Disc springs are particularly preferable, since they permit the storage of relatively large mechanical forces although the deflection, displacement or bending of each disc spring is relatively small. However, a saddle spring is also preferable as the spring device. The saddle spring is usually a ring-shaped body of resilient or spring material which is bent around a diameter of the ring form and is provided with a determined camber, curve or slope in the plane of such diameter. The saddle spring has the advantage that the full volume of the ring may be utilized for storing spring forces and that the deflection, displacement or bending of the spring is large, certainly essentially larger than that of a simple disc spring of either annular or frustoconical configuration.

The spring devices for the parts which are to be in pressure contact with each other may be coordinated. Thus, for example, in order to brace the spring against the end thereof which is opposite that which presses the semiconductor components against each other, a special metal cap may be utilized and the inside of the cup- or bell-shaped portion of the housing may be provided with a shoulder for abutment with such end of the spring. Devices of this type, however, create difficulties due to the spring device or its abutting end usually being electrically connected to one electrical pole of the semiconductor device and the ensuing need for electrical insulation between a semiconductor component and the other electrical pole of the semiconductor device, such as, for example, in the case of a diode, or against the other electrical pole in the path of the main current supply. This requires the use of appropriate electrically insulating intermediate layers, which during operation may be subjected to such stress that they could create considerable difficulties or damage.

The principal object of the present invention is to provide a new and improved structural component for the housing of a semiconductor device. The structural component of the present invention overcomes the disadvantages and difficulties inherent in the known semiconductor devices in which a spring device maintains semiconductor components in pressure contact with each other. The pressure contact transfers electrical current and heat between the encapsuled semiconductor element and its adjacent housing portions.

In accordance with the present invention, a structural member in a housing for a semiconductor device has components in abutting electrical contact with each other and a spring device having one end abutting a component of the semiconductor device. The housing includes a base member supporting the semiconductor device. The structural member comprises electrical insulating material such as ceramic material and is affixed to the base member and surrounds the semiconductor device. The structural member includes an abutment surface spaced from the semiconductor device, the other end of the spring device abutting the abutment surface of the structural member in a manner whereby the spring device applies a constant pressure between the abutting components of the semiconductor device.

The structural member comprises a hollow, substantially cylindrical configuration having an upper base of substantially annular configuration, a lower base of substantially annular configuration, an outer cylindrical surface of substantially constant diameter, an inner lower cylindrical surface of substantially constant diameter and an inner upper cylindrical surface of a substantially constant diameter smaller than the diameter of the inner lower cylindrical surface forming a shoulder of substantially annular configuration inside the structural member. The shoulder formed inside the structural member functions as the abutment surface. In a modification of the embodiment of the structural member of the present invention, the structural member may comprise a hollow substantially cylindrical configuration having an upper base of substantially annular configuration, a lower base of substantially annular configuration, an outer cylindrical surface of substantially constant diameter, an inner cylindrical surface of substantially constant diameter and a ring affixed to the inner cylindrical surface of the structural member in coaxial relation therewith and having a substantially annular abutment surface.

One of the components in abutting electrical contact comprises a substantially rod-like contact member passing into the housing and having a coaxial flange at its lower end coaxially positioned on the semiconductor device. The spring device comprises a plurality of spring washers coaxially positioned around the contact member and abutting at one end the flange of the base member, the base member having an upper surface and a substantially annular channel formed in the upper surface around the semiconductor device. The structural member is positioned in the channel formed in the base member and is affixed to the base member.

In order that the present invention may be readily carried into effect, it will now be described with reference to the accompanying drawing, wherein:

FIG. 1 is a view, partly in section, of a semiconductor device including an embodiment of the structural component of the present invention; and FIG. 2 is a sectional view of a part of a modification of the embodiment of the structural component of FIG. 1.

In FIG. 1, a base plate 1 of copper comprises part of the housing. The base plate 1 has a threaded end area 2 to facilitate threadedly coupling the semiconductor device to an external member, structure or system. The base plate 1 may be affixed to an external member, structure or system by any suitable means such as, for example, clamps, bolts or the like, which may pass through recesses in the base plate, and which need not be restricted to any particular type of fasteners. An annular groove, channel or recess 3 is formed in the upper surface of the base plate 1 and forms a substantially cylindrical support portion, having an upper surface upon which a semiconductor element or body 5 is positioned. The semiconductor element is provided at its electrodes with appropriate carrier plates comprising material having a thermal expansion coefficient which is very close to that of the semiconductor element.

The base plate 1 functions as one electrode connection of the semiconductor element 5 and a conductive contact member 6 functions as the other electrode connection of the semiconductor element. The lower end of the contact member 6 is provided with a flange 7 which has a suitably large under or lower surface for the application of pressure. The contact member 6 and its flange 7 may comprise an integral member.

In accordance with the present invention, the housing of the semiconductor device comprises a structural component 8. The structural component 8 comprises hollow cylinder or tubular configuration of electrical insulation material such as, for example, ceramic material. The structural component 8 has a shoulder 17 formed in its inside surface so that its inner diameter below the shoulder is larger than its inner diameter above the shoulder. The outer diameter of the structural component 8 is substantially constant. A substantially cup-shaped part 9 of metal is positioned over the upper base and opening of the structural component 8 and a stepped ring part 10 of metal is positioned around said component in the area of its lower base. The lower base of the structural component 8 is positioned in the channel 3 and the part 10 has a substantially vertical tubular portion 11 which is affixed to said structural component by any suitable means such as, for example, hard solder, and a substantially horizontal annular portion 12 which is a radially extending flange and which is affixed to a ring or annular member 13 by any suitable means such as, for example, hard solder.

The ring 13 comprises weldable material such as, for example, steel, and is affixed at its under or lower surface by an suitable means such as, for example, hard solder, to the base plate 1. The ring 13 thus functions to couple the upper housing portion to the base plate 1. The part 9 is resilient and functions as a cap to adjust or equalize the lengths of the components from a thermal as well as a purely meachanical point of view, against voltages which may occur during a compression of the contact member 6 with a sleeve 14. The part 9 is affixed at the inside cylindrical surface in the lower area thereof to the outer cylindrical surface of the structural component 8 in the area of the upper base of said structural component. The part 9 may be affixed to the structural member by any suitable fastening means such as, for example, hard solder.

The part 9 has a depressed portion formed in its base or upper surface and substantially coaxial with the contact member 6 and the sleeve 14 of tubular configuration is inserted into said depressed portion and soldered to the part 9. As shown in FIG. 1, the contact member 6 is an extension of an electrical power supply line and passes into the housing of the semiconductor device and makes electrical contact with said semiconductor device at the lower or under surface of the flange portion 7 of said contact member and the upper surface of said semiconductor device. The contact member 6 is compressed in and with the sleeve 14 by any suitable means such as, for example, the impression of suitable indentations, grooves, notches, or the like 15 by a suitable tool applied to the outside surface of said sleeve. The contact member 6 is thus tightly clamped inside the sleeve 14. The electrical power supply line passes into the sleeve 14 from the upper opening thereof and is compressed in and with said sleeve by any suitable means such as, for example, the impression of suitable indentations and the like 16, similar to the indentations and the like 16, similar to the indentations 15 and made in a similar manner. The lower surface of the electrical power supply line is in electrical contact with the upper surface of the contact member 6.

The shoulder 17 formed in the inside surface of the structural member 8 of the housing provides an abutment surface for the spring device 18. In the embodiment of FIG. 1, the spring device 18 comprises a plurality of disc springs or washers 18 coaxially positioned around the contact member 6 and positioned upon each other in a manner whereby the inner peripheral area of each washer abuts the inner peripheral area of the next adjacent washer on one side and the outer peripheral area of each washer abuts the outer peripheral area of the next adjacent washer on the other side. The plurality of spring washers 18 are thus positioned as shown in FIG. 1 and function to provide pressure in directions parallel to the axis of the contact member 6 on the flange 7 of said contact member via an intermediate washer or ring 19.

The ring 19 functions to position the contact member 6 in its axial position and to axially align the flange 7 of said contact member with the semiconductor device 5 so that pressure is uniformly applied to said semiconductor device by the spring device 18 via said ring. The under part of the spring device 18, which comprises the lowermost spring washer 18, abuts the ring 19 and the upper part of said spring device abuts the shoulder 17 of the structural member 8. The upper part of the spring device 18 comprises the uppermost spring washer 18. Another intermediate washer or ring 20 is preferably interposed between the uppermost spring washer 18 and the shoulder 17 to provide a uniform specific distribution of the pressure provided by the spring device 18 at said shoulder.

The positioning of the lower base of the structural component 8 in the channel 3 provides a protective shield around the semiconductor device 5, because the combination of said channel and said structural component protects the inside of the housing and said semiconductor device from any byproducts, such as undesirable particles or vapors, of the welding or soldering of the part 10 to the ring 13.

The shoulder 17 of the structural member 8 is positioned at a determined distance from its upper and lower bases. The housing may then be directly utilized as a jig during the assembly of the semiconductor device. To accomplish this, the shoulder 17 is preferably positioned at a distance from the bases of the structural member 8 which is such that when said structural member is positioned in the channel 3 and the spring device 18 and its associated components 19 and 20 are placed in position in relaxed condition and the contact member 6 is placed in position, the spring device does not extend beyond the lower base of the structural member.

In the modification shown in part in FIG. 2, the structural member 8*a* of the present invention comprises a hollow cylinder or tubular configuration of electrical insulation material such as, for example, ceramic material, having a substantially constant or uniform inner diameter and a substantially constant or uniform outer diameter. A metal washer or ring 21 of substantially annular configuration is affixed to the inside cylindrical surface by any suitable means such as, for example, hard solder 22. The ring 21 may comprise steel, for example.

The under or lower surface 21*a* of the ring 21 functions as the upper abutment surface for the spring device 18. The abutment surface 21*a* provided by the ring 21 is positioned at the same determined distance from the upper and lower bases (not shown in FIG. 2) of the structural member 8*a* that the shoulder 17 of the structural member 8 is positioned (FIG. 1).

While the invention has been described by means of a specific example and in a specific embodiment, we do not wish to be limited thereto, for obvious modifications will occur to those skilled in the art without departing from the spirit and scope of the invention.

We claim:

1. A semiconductor structural element, comprising a cylindrical cup-shaped member forming a housing and completely comprised of an insulating material;

a contact member insulated from and passing through said cup-shaped member;

a base plate rigidly connected with said cup-shaped member, said base plate having an upper surface and a channel formed in its upper surface, the side walls of said cup-shaped member being positioned with one edge in the channel formed in said base plate thereby forming a socket portion at said base plate upon which are stacked the components forming the conducting portions of the semiconductor element;

a semiconductor body connected via pressure contacts with the base plate and the contact member;

a metal ring affixed to the inside of the side walls of said cup-shaped member to form an abutment; and spring means having one end abutting said semiconductor body and another end abutting said metal ring.

2. A semiconductor structural element as claimed in claim 1, wherein said metal ring is affixed to said cup-shaped member by hard solder.

3. A semiconductor structural element as claimed in claim 2, wherein said abutment is positioned at a distance from the free rim of the side walls of said cup-shaped member corresponding to at least the height of said spring means and any members interposed between said abutment and the base plate when stacked upon the abutment in tension-free condition of said spring means.

4. A semiconductor structural element as claimed in claim 1, wherein said abutment is positioned at a distance from the free rim of the side walls of said cup-shaped member corresponding to at least the height of said spring means and any members interposed between said abutment and the base plate when stacked upon the abutment in tension-free condition of said spring means.

5. A semiconductor structural element as claimed in claim 1, wherein the channel formed in said base plate is of annular configuration and is formed around said semiconductor body.

6. A semiconductor structural element as claimed in claim 1, further comprising another metal ring affixed to said base plate in the outer portion of said base plate at the outer periphery of the channel formed therein and forming with said base plate a single structural component, and an annular member affixed to the outer surface of the side walls of said cup-shaped member and adapted to be affixed to said other metal ring.

7. A semiconductor structural element as claimed in claim 6, wherein said other metal ring is affixed to said base plate by hard solder.

8. A semiconductor structural element as claimed in claim 6, wherein said annular member is adapted to be affixed to said other metal ring by solder.

9. In a housing for a semiconductor device having components in abutting electrical contact with each other and spring means having one end abutting a component of said semiconductor device and another end, said housing including a base member supporting said semiconductor device, said base member having an upper surface and a substantially annular channel formed in its upper surface around said semiconductor device;

a structural member completely comprised of electrically insulating material positioned in the channel formed in said base member and affixed to said base member and surrounding said semiconductor device, the side walls of said cup-shaped member being positioned with one edge in the channel formed in said base plate thereby forming a socket portion at said base plate upon which are stacked the components forming the conducting portions of the semiconductor element, said structural member including an abutment surface spaced from said semiconductor device, the other end of said spring means abutting the abutment surface of said structural member in a manner whereby said spring means applies a constant pressure between the abutting components of said semiconductor device;

a substantially rod-like contact member passing into said housing, included with said components in abutting electrical contact, said contact member having a coaxial flange at its lower end coaxially positioned on said semiconductor device and having an upper end;

an electrical conductor having an end in proximity with the upper end of said contact member; and sleeve means covering the end of said electrical conductor and the upper end of said contact member and joining said conductor and contact member at said ends.

10. In a housing as claimed in claim 9, said structural member comprising a hollow substantially cylindrical configuration having an upper base of substantially annular configuration, a lower base of substantially annular configuration, an outer cylindrical surface of substantially constant diameter, an inner lower cylindrical surface of a substantially constant diameter and an inner upper cylindrical surface of a substantially constant diameter smaller than the diameter of the inner lower cylindrical surface forming a shoulder of substantially annular configuration inside said structural member.

11. In a housing as claimed in claim 10, a stepped ring having a substantially vertical portion of substantially cylindrical configuration and a substantially horizontal portion of substantially annular configuration affixed to the outer cylindrical surface of said structural member at its substantially vertical portion and affixed to said base member at its substantially horizontal portion.

12. In a housing as claimed in claim 9, said abutment surface comprising a shoulder formed in said structural member.

13. In a housing as claimed in claim 9, said structural member comprising a hollow substantially cylindrical configuration having an upper base of substantially annular configuration, a lower base of substantially annular configuration, an outer cylindrical surface of substantially constant diameter, an inner cylindrical surface of substantially constant diameter and a ring affixed to the inner cylindrical surface of said structural member in coaxial relation therewith and having a substantially annular abutment surface.

14. In a housing as claimed in claim 9, said spring means comprising a plurality of spring washers coaxially positioned around said contact member and abutting at said one end of said flange.

15. In a housing as claimed in claim 9, said sleeve means comprising a sleeve member having corresponding notches formed in one of its base areas and in said electrical conductor and having corresponding notches formed in the other of its base areas and in said contact member.

16. In a housing as claimed in claim 9, said structural member comprising ceramic material.

17. In a housing as claimed in claim 9, said structural member comprising a ceramic material of hollow substantially cylindrical configuration having an upper base of substantially annular configuration, a lower base of substantially annular configuration, an outer cylindrical surface of substantially constant diameter, an inner lower cylindrical surface of a substantially constant diameter and an inner upper cylindrical surface of a substantially constant diameter smaller than the diameter of the inner lower cylindrical surface forming a shoulder of substantially annular configuration inside said structural member, said spring means comprising a plurality of spring washers coaxially positioned around said contact member and abutting at said one end of said flange.

18. In a housing as claimed in claim 9, said sleeve means comprising a sleeve member having one base area compressed with said electrical conductor and another base area compressed with said contact member.

References Cited

UNITED STATES PATENTS

| | | | |
|---|---|---|---|
| 3,179,860 | 4/1965 | Clark et al. | 317—234 |
| 3,068,382 | 12/1962 | Wagner | 317—234 |
| 3,237,063 | 2/1966 | Keller | 317—234 |
| 3,294,895 | 12/1966 | Reintgen et al. | 317—234 X |
| 3,293,510 | 12/1966 | Pfaffenberger et al. | 317—234 |
| 3,368,120 | 2/1968 | Rankins | 317—234 |
| 3,378,735 | 4/1968 | Emeis | 317—234 |
| 3,293,510 | 12/1966 | Pfaffenberger et al. | 317—234 |
| 3,294,895 | 12/1966 | Reintgen et al. | 317—234 |
| 3,368,120 | 2/1968 | Rankins | 317—234 |
| 3,378,735 | 4/1968 | Emeis | 317—234 |

JAMES D. KALLAM, Primary Examiner

U.S. Cl. X.R.

174—50.52